(12) United States Patent
Aihara

(10) Patent No.: US 6,781,168 B1
(45) Date of Patent: Aug. 24, 2004

(54) SEMICONDUCTOR DEVICE

(75) Inventor: Kazuhiro Aihara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/617,665

(22) Filed: Jul. 14, 2003

(30) Foreign Application Priority Data

Feb. 13, 2003 (JP) .................................. 2003-034933

(51) Int. Cl.[7] .............................................. H01L 29/76
(52) U.S. Cl. ...................... 257/288; 257/369; 257/413; 257/616
(58) Field of Search .............................. 257/288, 368, 257/369, 412, 413, 616; 438/585, 592

(56) References Cited

U.S. PATENT DOCUMENTS

| | | | |
|---|---|---|---|
| 6,362,055 B2 | * | 3/2002 | Lin et al. ...................... 438/275 |
| 2003/0132506 A1 | * | 7/2003 | Rhee et al. .................. 257/616 |
| 2004/0012055 A1 | * | 1/2004 | Rhee et al. .................. 257/411 |

FOREIGN PATENT DOCUMENTS

| | | |
|---|---|---|
| JP | 4-142080 | 5/1992 |
| JP | 6-120501 | 4/1994 |

* cited by examiner

Primary Examiner—Tuan H. Nguyen
(74) Attorney, Agent, or Firm—Oblon, Spivak, McClelland, Maier & Neustadt, P.C.

(57) ABSTRACT

A source region (2) and a drain region (3) both containing n-type impurities are formed on a p-type Si semiconductor substrate (1) containing p-type impurities. On an active region of the surface of the p-type Si semiconductor substrate (1) between the source region (2) and the drain region (3), a gate insulating film (4) is formed. An n-type SiGe mixed crystal film (5) containing n-type impurities is formed on the gate insulating film (4) and a p-type SiGe mixed crystal film (6) containing p-type impurities is formed on the n-type SiGe mixed crystal film (5). A semiconductor device including such a transistor can further inhibit an increase in leakage current flowing between the gate electrode and the drain through the gate insulating film.

6 Claims, 2 Drawing Sheets

SEMICONDUCTOR DEVICE

BACKGROUND OF THE INVENTION

1. Field of the Invention

The present invention relates to a semiconductor device, and especially to a transistor that is capable of inhibiting an increase in leakage current in a gate insulating film.

2. Description of the Background Art

One example of the well-known transistors used in semiconductor devices is a MISFET (Metal-Insulator-Semiconductor Field Effect Transistor). An n-channel MISFET is configured such that source and drain regions doped with n-type impurities are formed on a p-type Si substrate, and a gate insulating film and an n-type Si crystal film for gate electrode applications are formed in this order in layers on the p-type Si substrate between the source and drain regions.

The operation of this n-channel MISFET is described hereinbelow. First, the p-type Si substrate is grounded and a positive threshold potential is applied to the gate electrode. Then, a potential difference is produced between the source and drain regions to cause the flow of drain current. This state is the ON state of the n-channel MISFET. Next, the p-type Si substrate is grounded and a negative potential is applied to the gate electrode. In this case, even if a potential difference is produced between the source and drain regions, no drain current flows because a channel region is shut off. This state is the OFF state of the n-channel MISFET.

With higher integration of semiconductor devices, the element cell size is shrinking. When the n-channel MISFET is in the OFF state, the application of a 0 volt potential to the gate electrode cannot shut off the drain current due to punch-through phenomena occurring between the source and drain regions. That is, the drain current can only be shut off by the application of a negative potential.

However, applying a negative potential to the gate electrode produces a potential difference between the gate electrode and the drain region. This potential difference causes an increase in leakage current flowing between the gate electrode and the drain region through the gate insulating film. The increased leakage current has the problems of degrading the transistor characteristics of the n-channel MISFET and affecting circuit operation of the n-channel MISFET.

In Japanese Patent Application Laid-open No. 6-120501 (1994) (pp. 2–4, FIGS. 1–5), an n-type polycrystalline silicon layer and a p-type polycrystalline silicon layer are formed in layers on an oxide silicon film which makes a gate insulating film, and then patterned to form a gate electrode. Thus, at a gate voltage within its operating range, drain current dependent on the gate voltage is observed; while, at a gate voltage outside its operating range, drain current is almost constant independently of the gate voltage. This inhibits an increase in leakage current.

In recent years, however, semiconductor device manufacturing is moving toward even higher integration and the element cell size is further shrinking. Thus, it is impossible to satisfactorily inhibit an increase in leakage current by only forming the gate electrode from n-type and p-type polycrystalline silicon layers which are stacked one above the other. Besides, the gate electrode formed of polycrystalline silicon has high electric resistance and thus, can reduce the operating speed of the transistor.

SUMMARY OF THE INVENTION

An object of the present invention is to provide a semiconductor device including a transistor that is capable of further inhibiting an increase in leakage current flowing between the gate electrode and the drain through a gate insulating film.

According to an aspect of the present invention, the semiconductor device includes a p-type semiconductor substrate, an n-type source region, an n-type drain region, a gate insulating film, a first film, and a second film. The n-type source region and the n-type drain region are formed in the p-type semiconductor substrate. The gate insulating film is formed on the p-type semiconductor substrate sandwiched between the n-type source region and the n-type drain region. The first film is of n-type Ge semiconductor or n-type SiGe mixed crystal semiconductor formed in a layer on the gate insulating film. The second film is of p-type Ge semiconductor or p-type SiGe mixed crystal semiconductor formed in a layer on the first film, forming a gate electrode with the first film.

The semiconductor device according to the present invention, as compared with conventional n-channel transistors, has the effect of further inhibiting an increase in leakage current flowing between the gate electrode and the drain through the gate insulating film. It also has the effect of speeding up drive of the n-channel transistor.

According to another aspect of the present invention, the semiconductor device includes an n-type semiconductor substrate, a p-type source region, a p-type drain region, a gate insulating film, a first film, and a second film. The p-type source region and the p-type drain region are formed in the n-type semiconductor substrate. The gate insulating film is formed on the n-type semiconductor substrate sandwiched between the p-type source region and the p-type drain region. The first film is of p-type Ge semiconductor or p-type SiGe mixed crystal semiconductor formed in a layer on the gate insulating film. The second film is of n-type Ge semiconductor or n-type SiGe mixed crystal semiconductor formed in a layer on the first film, and forms a gate electrode with the first film.

The semiconductor device according to the present invention, as compared with conventional p-channel transistors, has the effect of further inhibiting an increase in leakage current flowing between the gate electrode and the drain through the gate insulating film. It also has the effect of speeding up drive of the p-channel transistor.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinbelow, preferred embodiments of the present invention are specifically described with reference to the drawings.

First Preferred Embodiment

Figure 1:
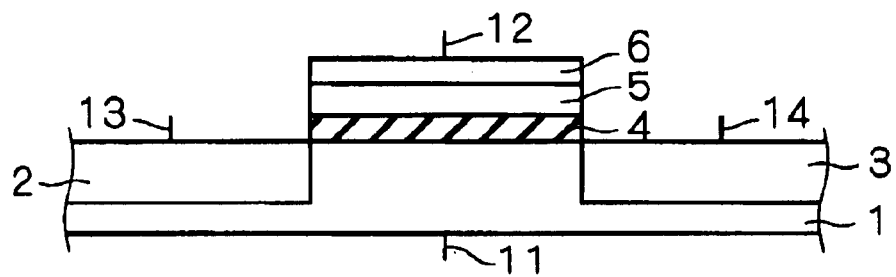
FIG. 1 is a cross-sectional view of a transistor included in a semiconductor device according to a first preferred embodiment of the present invention.

FIG. 1 shows a cross-sectional view of a transistor included in a semiconductor device according to the present preferred embodiment. In FIG. 1, a source region 2 and a drain region 3 both containing n-type impurities are formed on a p-type Si semiconductor substrate 1 containing p-type impurities. On an active region of the surface of the p-type Si semiconductor substrate 1 between the source region 2 and the drain region 3, a gate insulating film 4 is formed. An n-type SiGe mixed crystal film 5 containing n-type impurities is formed on the gate insulating film 4 and a p-type SiGe mixed crystal film 6 containing p-type impurities is formed on the n-type SiGe mixed crystal film 5. The two layers of the n-type SiGe mixed crystal film 5 and the p-type SiGe mixed crystal film 6 constitute a gate electrode of the transistor according to the present preferred embodiment. The transistor according to the present preferred embodiment is an n-channel transistor.

The operation of the transistor according to the present preferred embodiment shown in FIG. 1 is described hereinbelow. First, the p-type Si semiconductor substrate 1 is provided with an electrode terminal 11 which is grounded. The p-type SiGe mixed crystal film 6 for gate electrode applications is provided with an electrode terminal 12 to which a positive potential is applied so that a voltage applied to the source is higher than the threshold potential of the transistor. The source region 2 and the drain region 3 are provided respectively with an electrode terminal 13 and an electrode terminal 14, and a potential difference is produced between the electrode terminals 13 and 14. Thereby, drain current flows and the transistor according to the present preferred embodiment is brought into its ON state.

In the transistor according to the present preferred embodiment, since the gate electrode is composed of the two layers of the n-type SiGe mixed crystal film 5 and the p-type SiGe mixed crystal film 6, it is necessary to apply a higher potential to the electrode terminal 12 than in conventional transistors. That is, a potential that will not form a depletion layer at a pn junction between the n-type SiGe mixed crystal film 5 and the p-type SiGe mixed crystal film 6 needs to be applied to the electrode terminal 12.

Then, with the electrode terminal 11 being grounded, a negative potential is applied to the electrode terminal 12 so that a negative potential difference is applied to the source. At this time, even if a potential difference is produced between the electrode terminals 13 and 14, no drain current flows in the transistor according to the present preferred embodiment because the channel region of the transistor is shut off. That is, the transistor is in the OFF state. Even the application of a 0 volt potential to the electrode terminal 12 cannot shut off the drain current due to punch-through phenomena occurring between the source region 2 and the drain region 3. Thus, the drain current is shut off by applying a negative potential to the electrode terminal 12.

In the transistor according to the present preferred embodiment, even in the OFF state, a potential difference is created between the gate electrode and the drain region 3. Hence, leakage current flows between the gate electrode and the drain region 3 through the gate insulating film 4. The gate electrode of the transistor according to the present preferred embodiment, however, has the pn junction of the n-type SiGe mixed crystal film 5 and the p-type SiGe mixed crystal film 6. Thus, if a reverse bias is applied to the pn junction, a depletion layer which is equivalent to an electric capacitance connected in series to the gate insulating film 4 is formed at the pn junction. In the transistor according to the present preferred embodiment, therefore, the depletion layer inhibits an increase in leakage current flowing through the gate insulating film 4.

Here, the pn junction of the n-type SiGe mixed crystal film 5 and the p-type SiGe mixed crystal film 6 in the gate electrode inhibits an increase in leakage current flowing through the gate insulating film 4 by utilizing the characteristic of rectification of a pn junction diode. That is, if a positive potential is applied to the electrode terminal 12 on the p-type SiGe mixed crystal film 6, a forward bias is applied to the pn junction in the gate electrode, while if a negative potential is applied to the electrode terminal 12, a reverse bias is applied to the pn junction in the gate electrode.

Further, since the gate electrode of the transistor according to the present preferred embodiment is composed of the n-type SiGe mixed crystal film 5 and the p-type SiGe mixed crystal film 6, an increase in leakage current flowing through the gate insulating film 4 can further be inhibited than when the gate electrode is composed of n-type Si film and p-type Si film. In general, the application of a higher reverse voltage to the pn junction causes dielectric breakdown due to the Zener effect (or Zener tunneling), but on the other hand, the breakdown voltage increases with increasing permittivity of the depletion layer. Since the relative permittivity (16.1) of germanium (Ge) is higher than the relative permittivity (11.9) of silicon, germanium (Ge) has a higher breakdown voltage. That is, germanium, as compared with silicon, can keep down the leakage current at a higher reverse voltage. Still further, since the gate electrode composed of the n-type SiGe mixed crystal film 5 and the p-type SiGe mixed crystal film 6 can further inhibit an increase in leakage current flowing through the gate insulating film 4, it is possible to reduce the thickness of the gate insulating film 4.

While in the present example, the gate electrode of the transistor according to the present preferred embodiment is composed of the n-type SiGe mixed crystal film 5 and the p-type SiGe mixed crystal film 6, germanium (Ge) has a higher relative permittivity than SiGe mixed crystal. Thus, a gate electrode composed of n-type Ge film and p-type Ge film provides a larger electric capacitance of the depletion layer formed at the pn junction with the application of a reverse bias. From this, the gate electrode composed of n-type Ge film and p-type Ge film, as compared with the gate electrode composed of the n-type SiGe mixed crystal film 5 and the p-type mixed crystal film 6, can further inhibit an increase in leakage current flowing through the gate insulating film 4. In the present invention, the gate electrode needs not be a combination of n-type SiGe mixed crystal film and p-type SiGe mixed crystal film or a combination of n-type Ge film and p-type Ge film, but may be a combination of n-type SiGe mixed crystal film and p-type Ge film or a combination of n-type Ge film and p-type SiGe mixed crystal film.

The resistivity of germanium (Ge) is 60 $\Omega$cm, which is lower than the resistivity of silicon (Si), 230 k$\Omega$cm. Thus, the SiGe mixed crystal film has a lower resistivity than the Si film. Since the gate electrode of the transistor according to the present preferred embodiment is composed of the n-type SiGe mixed crystal film 5 and the p-type SiGe mixed crystal film 6, it has a lower electric resistance than the gate electrodes of conventional transistors. This results in the speeding up of drive of the transistor according to the present preferred embodiment.

Next, a method of manufacturing the SiGe mixed crystal films 5 and 6 which form the gate electrode of the transistor according to the present preferred embodiment is described hereinbelow. The SiGe mixed crystal films 5 and 6 are formed by CVD (Chemical Vapor Deposition), at which time a mixture ratio of germanium (Ge) to silicon (Si) in mixed crystal can be changed by controlling a flow-rate ratio of gas species containing silicon (Si) to gas species containing germanium (Ge). This produces the SiGe mixed crystal films 5 and 6 each having an arbitrary mixture ratio.

Here, the mixture ratio (in units of at. %) represents the ratio of germanium (Ge) to silicon (Si). The gate electrode of the transistor according to the present preferred embodiment employs the SiGe mixed crystal films 5 and 6 having a mixture ratio of 30 at. % due to technical problems in film formation. In theory, however a higher mixture ratio can further inhibit an increase in leakage current flowing between the gate electrode and the drain and can reduce the resistivity of the gate electrode. In the present invention, therefore, the mixture ratio is not limited to 30 at. %. The gate electrode composed of n-type Ge film and p-type Ge film can be formed by CVD without using gas species containing silicon (Si).

The gate electrode of the transistor according to the present preferred embodiment is composed of the two layers of the n-type SiGe mixed crystal film 5 and the p-type SiGe mixed crystal film 6. Those two layers of the SiGe mixed crystal films 5 and 6 are formed continuously by CVD. The n-type SiGe mixed crystal film 5 and the p-type SiGe mixed crystal film 6 are formed by switching between gas species containing n-type impurity elements and gas species containing p-type impurity elements in film formation by CVD. Here, the n-type impurity elements are phosphorous (P), arsenic (As), antimony (Sb), etc. and the p-type impurity elements are boron (B), indium (In), etc.

As so far described, the semiconductor device according to the present preferred embodiment is a semiconductor device including the n-channel transistor which comprises a gate electrode having a first film of n-type Ge semiconductor or n-type SiGe mixed crystal semiconductor formed in a layer on the gate insulating film and a second film of p-type Ge semiconductor or p-type SiGe mixed crystal semiconductor formed in a layer on the first film. This transistor, as compared with conventional transistors, can further inhibit an increase in leakage current flowing between the gate electrode and the drain through the gate insulating film. The semiconductor device according to the present preferred embodiment can further speed up drive of the transistor.

Modification of First Preferred Embodiment

Figure 2:
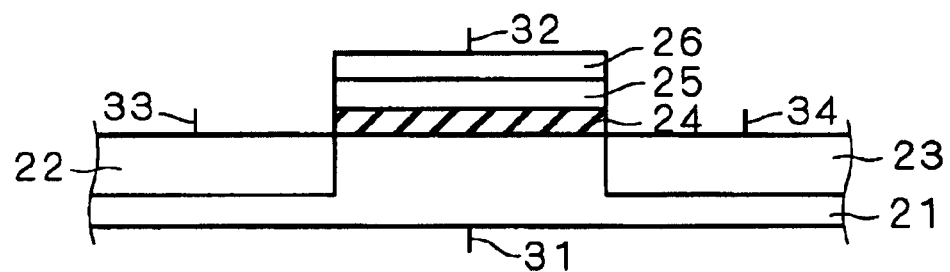
FIG. 2 is a cross-sectional view of a transistor included in a semiconductor device according to a modification of the first preferred embodiment of the present invention.

FIG. 2 shows a cross-sectional view of a transistor included in a semiconductor device according to a modification of the present preferred embodiment. In FIG. 2, a source region 22 and a drain region 23 both containing p-type impurities are formed on an n-type Si semiconductor substrate 21 containing n-type impurities. On an active region of the surface of the n-type Si semiconductor substrate 21 between the source region 22 and the drain region 23, a gate insulating film 24 is formed. A p-type SiGe mixed crystal film 25 containing p-type impurities is formed on the gate insulating film 24 and an n-type SiGe mixed crystal film 26 containing n-type impurities is formed on the p-type SiGe mixed crystal film 25. The two layers of the p-type SiGe mixed crystal film 25 and the n-type SiGe mixed crystal film 26 constitute a gate electrode of the transistor according to this modification. The transistor according to this modification is a p-channel transistor.

The operation of the transistor according to this modification shown in FIG. 2 is contrary to that of the transistor according to the present preferred embodiment shown in FIG. 1. The n-type Si semiconductor substrate 21 is provided with an electrode terminal 31 which is grounded. The n-type SiGe mixed crystal film 26 for gate electrode applications is provided with an electrode terminal 32 to which a negative potential is applied so that a voltage applied to the source is lower than a negative threshold potential of the transistor. The source region 22 and the drain region 23 are provided respectively with an electrode terminal 33 and an electrode terminal 34, and a potential difference is produced between the electrode terminals 33 and 34. Thereby, drain current flows and the transistor according to this modification is brought into its ON state.

Then, with the electrode terminal 31 being grounded, a positive potential is applied to the electrode terminal 32 so that a positive potential difference is applied to the source. At this time, even if a potential difference is produced between the electrode terminals 33 and 34, no drain current flows in the transistor according to this modification because the channel region of the transistor is shut off. That is, the transistor is in the OFF state.

Like the transistor according to the present preferred embodiment, the transistor according to this modification can further inhibit an increase in leakage current flowing through the gate insulating film 24. Also, the gate electrode of the transistor according to this modification, as that of the transistor according to the present preferred embodiment, may be composed of p-type Ge film and n-type Ge film, instead of being composed of the p-type SiGe mixed crystal film 25 and the n-type SiGe mixed crystal film 26. Further, the gate electrode may be a combination of p-type SiGe mixed crystal film and n-type Ge film or a combination of p-type Ge film and n-type SiGe mixed crystal film.

As so far described, the semiconductor device according to this modification is a semiconductor including the p-channel transistor which comprises the gate electrode having a first film of p-type Ge semiconductor or p-type SiGe mixed crystal semiconductor formed in a layer on the gate insulating film and a second film of n-type Ge semiconductor or n-type SiGe mixed crystal semiconductor formed in a layer on the first film. Thus, this transistor, as compared with conventional transistors, can further inhibit an increase in leakage current flowing between the gate electrode and the drain through the gate insulating film. The semiconductor device according to this modification can further speed up drive of the transistor.

Second Preferred Embodiment

Figure 3:
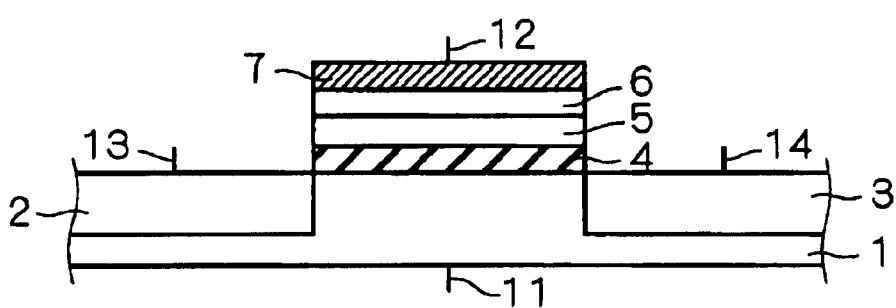
FIG. 3 is a cross-sectional view of a transistor included in a semiconductor device according to a second preferred embodiment of the present invention.

FIG. 3 shows a cross-sectional view of a transistor included in a semiconductor device according to the present preferred embodiment. In FIG. 3, the source region 2 and the drain region 3 both containing n-type impurities are formed on the p-type Si semiconductor substrate 1 containing p-type impurities. On the active region of the surface of the p-type Si semiconductor substrate 1 between the source region 2 and the drain region 3, the gate insulating film 4 is formed. The n-type SiGe mixed crystal film 5 containing n-type impurities is formed on the gate insulating film 4 and the p-type SiGe mixed crystal film 6 containing p-type impurities is formed on the n-type SiGe mixed crystal film 5. Further, a metal film 7 is formed on the p-type SiGe mixed crystal film 6. The gate electrode of the transistor according to the present preferred embodiment is composed of three layers of the n-type SiGe mixed crystal film 5, the p-type SiGe mixed crystal film 6 and the metal film 7. The transistor according to the present preferred embodiment is an n-channel transistor.

The operation of the transistor according to the present preferred embodiment is identical to that described in the first preferred embodiment. The present preferred embodiment, however, differs from the first preferred embodiment in that the electrode terminal 12 is formed not on the p-type SiGe mixed crystal film 6 but on the metal film 7. Further, since the metal film 7 is used for the gate electrode of the transistor according to the present preferred embodiment, this gate electrode has lower resistivity than the gate electrode of the first preferred embodiment. The transistor according to the present preferred embodiment can thus further speed up the operation. The material of the metal film 7 is, for example, an element such as aluminum (Al), tungsten (W) or molybdenum (Mo), or a silicide material thereof, or an alloy of those materials. The metal film 7 is formed on the p-type SiGe mixed crystal film 6 by, for example, sputtering.

The semiconductor device according to the present preferred embodiment comprises the gate electrode which further has the metal film 7 formed in a layer on the p-type SiGe mixed crystal film 6. It can thus further reduce the electrical resistance of the gate electrode and can further speed up drive of the transistor.

Modification of Second Preferred Embodiment

Figure 4:
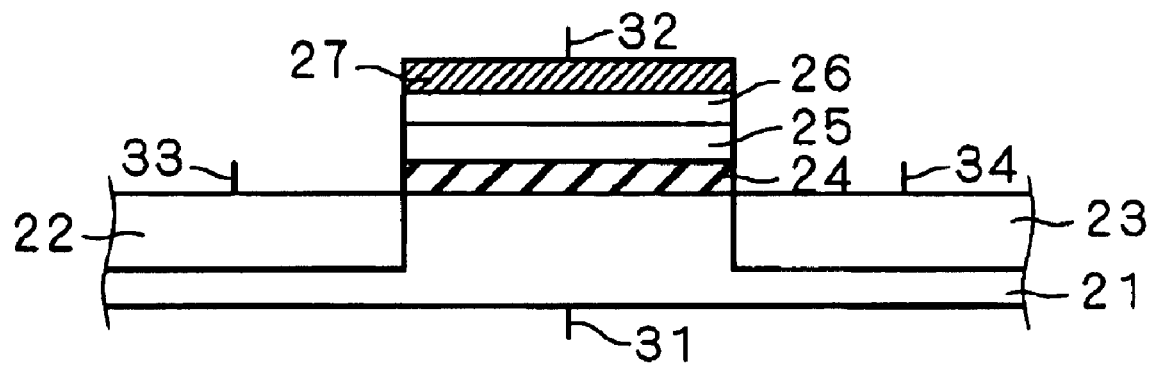
FIG. 4 is a cross-sectional view of a transistor included in a semiconductor device according to a modification of the second preferred embodiment of the present invention.

FIG. 4 shows a cross-sectional view of a transistor included in a semiconductor device according to a modification of the present preferred embodiment. In FIG. 4, the source region 22 and the drain region 23 both containing p-type impurities are formed on the n-type Si semiconductor substrate 21 containing n-type impurities. On the active region of the surface of the n-type Si semiconductor substrate 21 between the source region 22 and the drain region 23, the gate insulating film 24 is formed. The p-type SiGe mixed crystal film 25 containing p-type impurities is formed on the gate insulating film 24 and the n-type SiGe mixed crystal film 26 containing n-type impurities is formed on the p-type SiGe mixed crystal film 25. Further, a metal film 27 is formed on the n-type SiGe mixed crystal film 26. The gate electrode of the transistor according to this modification is composed of three layers of the p-type SiGe mixed crystal film 25, the n-type SiGe mixed crystal film 26, and the metal film 27. The transistor according to this modification is a p-channel transistor. The operation of the transistor according to this modification shown in FIG. 4 is identical to that described in the modification of the first preferred embodiment. This modification, however, differs from the modification of the first preferred embodiment in that the electrode terminal 32 is provided not on the n-type SiGe mixed crystal film 26 but on the metal film 27.

The semiconductor device according to this modification comprises the gate electrode which further has the metal film 27 formed in a layer on the n-type SiGe mixed crystal film 26. It can thus further reduce the electrical resistance of the gate electrode and can further speed up drive of the transistor.

Third Preferred Embodiment

Figure 5:
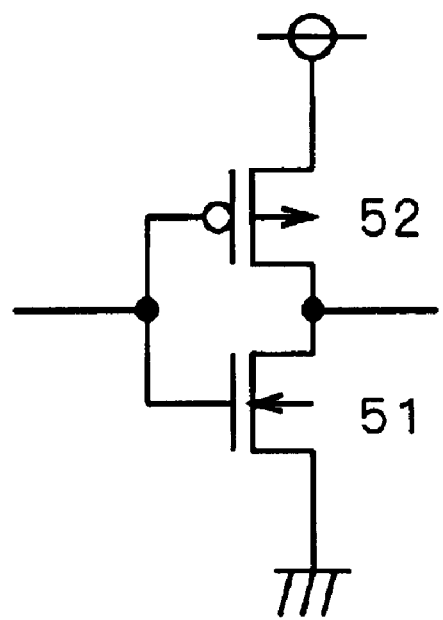
FIG. 5 is a cross-sectional view of an inverter constituted by a CMOS according to a third preferred embodiment of the present invention.

The semiconductor device according to the present preferred embodiment constitutes a CMOS (Complementary Metal Oxide Semiconductor) using the n-channel transistor illustrated in the first or second preferred embodiment and the p-channel transistor illustrated in the modification of the first or second preferred embodiment. FIG. 5 shows a circuit diagram of an inverter constituted by the CMOS. An n-channel transistor 51 of this CMOS is constituted by the n-channel transistor illustrated in the first or second preferred embodiment, and a p-channel transistor 52 is constituted by the p-channel transistor illustrated in the modification of the first or second preferred embodiment.

The n-channel transistor of the first or second preferred embodiment and the p-channel transistor of the modification of the first or second preferred embodiment, as compared with conventional transistors, each have the effect of inhibiting an increase in leakage current flowing through the gate insulating film and the effect of reducing the electrical resistance of the gate electrode and thereby speeding up drive of the transistor. The CMOS according to the present preferred embodiment can thus achieve the effects of the first and second preferred embodiments and the modifications thereof as well as the effect achieved by itself (e.g., reduction in power consumption).

While the semiconductor device according to the present preferred embodiment constitutes a CMOS using the n-channel transistor illustrated in the first or second preferred embodiment and the p-channel transistor illustrated in the modification of the first or second preferred embodiment, the present invention is not limited thereto. For example, the semiconductor device may constitute a semiconductor storage device using the n-channel transistor of the first or second preferred embodiment and the p-channel transistor of the modification of the first or second preferred embodiment.

As so far described, the semiconductor device according to the present preferred embodiment is a semiconductor device including the CMOS transistor which comprises the n-channel transistor of the first or second preferred embodiment and the p-channel transistor of the modification of the first or second preferred embodiment. The CMOS transistor, as compared with conventional transistors, can thus further inhibit an increase in leakage current flowing between the gate electrode and the drain through the gate insulating film, can speed up drive of the transistors by reducing the resistivity of the gate electrode, and can reduce power consumption that is the feature of the CMOS transistor.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a p-type semiconductor substrate;

an n-type source region an n-type drain region, both formed in said p-type semiconductor substrate;

a gate insulating film formed on said p-type semiconductor substrate sandwiched between said n-type source region and said n-type drain region;

a first film of n-type Ge semiconductor or n-type SiGe mixed crystal semiconductor formed in a layer on said gate insulating film; and a second film of p-type Ge semiconductor or p-type SiGe mixed crystal semiconductor formed in a layer on said first film, said first film and said second film forming a gate electrode.

2. The semiconductor device according to claim 1, wherein said gate electrode further has a metal film formed in a layer on said second film.

3. A semiconductor device comprising:

an n-type semiconductor substrate;

a p-type source region and a p-type drain region, both formed in said n-type semiconductor substrate;

a gate insulating film formed on said n-type semiconductor substrate sandwiched between said p-type source region and said p-type drain region;

a first film of p-type Ge semiconductor or p-type SiGe mixed crystal semiconductor formed in a layer on said gate insulating film; and a second film of n-type Ge semiconductor or n-type SiGe mixed crystal semiconductor formed in a layer on said first film, said first film and said second film forming a gate electrode.

4. The semiconductor device according to claim 3, wherein said gate electrode further has a metal film formed in a layer on said second film.

5. A semiconductor device comprising:

an n-channel transistor; and a p-channel transistor, said n-channel transistor comprising:

a p-type semiconductor substrate;

an n-type source region and an n-type drain region, both formed in said p-type semiconductor substrate;

a gate insulating film formed on said p-type semiconductor substrate sandwiched between said n-type source region and said n-type drain region;

a first film of n-type Ge semiconductor or n-type SiGe mixed crystal semiconductor formed in a layer on said gate insulating film; and a second film of p-type Ge semiconductor or p-type SiGe mixed crystal semiconductor formed in a layer on said first film, said first film and said second film forming a gate electrode of said n-channel transistor, said p-channel transistor comprising:

an n-type semiconductor substrate;

a p-type source region and a p-type drain region, both formed in said n-type semiconductor substrate;

a gate insulating film formed on said n-type semiconductor substrate sandwiched between said p-type source region and said p-type drain region;

a third film of p-type Ge semiconductor or p-type SiGe mixed crystal semiconductor formed in a layer on said gate insulating film; and a fourth film of n-type Ge semiconductor or n-type SiGe mixed crystal semiconductor formed in a layer on said third film, said third film and said fourth film forming a gate electrode of said p-channel transistor, said n-channel transistor and said p-channel transistor constituting a CMOS transistor.

6. The semiconductor device according to claim 5, wherein said gate electrode of said n-channel transistor further has a first metal film formed in a layer on said second film, said gate electrode of said p-channel transistor further has a second metal film formed in a layer on said fourth film.

* * * * *